United States Patent
Fan et al.

(10) Patent No.: US 6,687,160 B1
(45) Date of Patent: *Feb. 3, 2004

(54) REFERENCE CURRENT GENERATION CIRCUIT FOR MULTIPLE BIT FLASH MEMORY

(75) Inventors: Tso-Hung Fan, Taipei Hsien (TW); Chih-Chieh Yeh, Taipei (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/064,918

(22) Filed: Aug. 29, 2002

(51) Int. Cl.[7] .................................. G11C 16/06
(52) U.S. Cl. .................... 365/185.2; 365/185.18; 365/189.09

(58) Field of Search .................. 365/185.2, 185.18, 365/189.09, 185.33, 185.27, 210

(56) References Cited

U.S. PATENT DOCUMENTS 6,434,049 B1 * 8/2002 Trivedi et al. ............ 365/185.2

* cited by examiner

Primary Examiner—David Lam
(74) Attorney, Agent, or Firm—Jiang Chyun IP Office

(57) ABSTRACT

A reference current generation circuit for the multiple bit flash memory provided by the present invention applies the same boosted word-line voltage to the gates of different reference current generation unit's reference cells, and uses different gate lengths from different reference cells to obtain the reference currents with different levels that are needed. Therefore, it effectively solves the problem of the reference currents having different drifts along with the variance of the temperature and the power voltage Vcc.

6 Claims, 3 Drawing Sheets

REFERENCE CURRENT GENERATION CIRCUIT FOR MULTIPLE BIT FLASH MEMORY

BACKGROUND OF INVENTION

1. Field of Invention

The present invention generally relates to a multiple bit flash memory, and more particularly, to a reference current generation circuit for the multiple bit flash memory.

2. Description of Related Art

Flash memory is one kind of the non-volatile memory that performs multiple data program, read and erase operations. Since the data stored in it does not disappear due to the interruption of the power supply and the stored data is easy to be modified via the erase and program operation, it is widely used now in electronic equipment such as the personal computer.

The typical flash memory comprises a plurality of flash cells, and each flash cell generally stores a bit of data. The doped polycrystalline silicon is used to form a floating gate and a control gate of the flash memory. The floating gate and the control gate are isolated by a dielectric layer, and the floating gate and the substrate are isolated by a tunnel oxide. When the flash cells are performing the program/erase operation, a bias voltage is applied onto the control gate and drain to inject electrons into the floating gate or pull out electrons from the floating gate. When reading data from the flash cells, a word-line voltage is applied onto the control gate. The electric status of the floating gate impacts the ON/OFF status of the channel below it, and the ON/OFF status of the channel is used to determine whether the data is "0" or "1".

In line with progress in semiconductor technology and the increase in the requirements for flash memory capacity, a multiple bit flash memory has been developed, and each flash cell stores a data that has more than two bits. Therefore, when reading the data stored in the flash cells, the current that is read has to compare with a reference current to determine the value of the stored data.

FIG. 1 schematically shows a sketch map of the threshold voltage distribution for the flash memory's 2-bit flash cell. Where the abscissa represents the magnitude of the threshold voltage Vth, and the ordinate represents the quantity of each threshold voltage Vth's flash cell. Moreover, the quantity distribution is like a gauss distribution as shown in the diagram. From FIG. 1, when erasing the flash cells, the threshold voltage Vth is below EV; when programming a "01" data value into the flash memory, the threshold voltage Vth is between $PV_1$ and $R_2$; when programming a "10" data value into the flash memory, the threshold voltage Vth is between $PV_2$ and $R_3$, and when programming an "11" data value into the flash memory, the threshold voltage Vth is above $PV_3$. Therefore, the word-line voltage EV is applied onto the control gate when erasing the flash cells, and whether the erasing operation is completed or not is determined via the read current; when programming "01", "10", and "11" data values into the flash cells, the word-line voltage $PV_1$, $PV_2$, and $PV_3$ are respectively applied onto the control gate, and whether the programming operation is completed or not is determined via the read current. When reading the data value stored in the flash cells, the word-line voltages $R_1$, $R_2$, and $R_3$ are respectively applied onto the control gate, and the data value is determined via the read current. Moreover, the read current is compared with a reference current to determine the data value that is read.

The conventional reference current generation circuit used to achieve the objective mentioned above applies the boosted word-line voltages (BWLV) with different levels onto gates of different reference cells. When the 2-bit flash cell mentioned above is exemplified, since totally there are seven different levels for the word-line voltages for the erase verify, the program verify, and the read operations, they are EV, $PV_1$, $PV_2$, $PV_3$, $R_1$, $R_2$, and $R_3$, so that the boosted word-line voltages with seven different levels are needed for implementation. For example, the boosted word-line voltages with 15 different levels are needed to implement the 3-bit flash cell. Since each boosted word-line voltage has different variance when it is impacted by the variance of the temperature and the power voltage Vcc, each reference current generated by the reference generation circuit via this method has different drift along with the variance of the temperature and the power voltage Vcc.

SUMMARY OF INVENTION

Therefore, the present invention provides a reference current generation circuit, it can solve the problem of the reference currents having different drifts along with the variance of the temperature and the power voltage Vcc.

In order to achieve the objective mentioned above and others, the present invention provides a reference current generation circuit and it is suitable for a multiple bit flash memory. The reference current generation circuit comprises a plurality of reference current generation units, and each reference current generation unit comprises a load and a reference cell. The load comprises a first connection terminal and a second connection terminal, wherein the first connection terminal couples to an operating power, the second connection terminal couples to a first source/drain of the reference cell, the second source/drain is grounded, the gate of the reference cell couples to a boosted word-line voltage. The gate of each reference current generation unit couples to the same boosted word-line voltage, and the gate width of the reference cell for each reference current generation unit is different based on the magnitude of a reference current needed to be generated by the reference current generation circuit.

In a preferred embodiment of the present invention, the reference cell is a dummy cell, and the so-called dummy cell is formed by merging the floating gate and the control gate of the multiple bit flash memory's flash cell having the same structure together. For ease of handling the reference cell characteristic, the dimension of the gate length of the reference cell for each reference current generation unit should be made the same, and the dimension of the gate length of the reference cell should be made greater than the dimension of the gate length of the multiple bit flash memory's flash cell. For example, the dimension of the gate length of the reference cell should be designed as 1 $\mu$m.

Moreover, in order to further improve the characteristics of the reference cells, the reference cells whose quantity are greater than the quantity needed by each reference current generation unit are formed in the same bank, and one or more than one reference cells are used to generate the reference current. When a plurality of the same reference cells in the same bank are used to generate the reference current, all the same reference cells used are tightly coupled in parallel to generate the reference current.

From the description mentioned above, the reference current generation circuit provided by the present invention applies the same boosted word-line voltage to the gates of different reference cells, and uses different gate lengths from different reference cells to obtain the reference currents with different levels that are needed. Therefore, it effectively solves the problem of the reference currents having different drifts along with the variance of the temperature and the power voltage Vcc.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a sketch map of the threshold voltage distribution for the flash memory's 2-bit flash cell.

DETAILED DESCRIPTION

Figure 1:
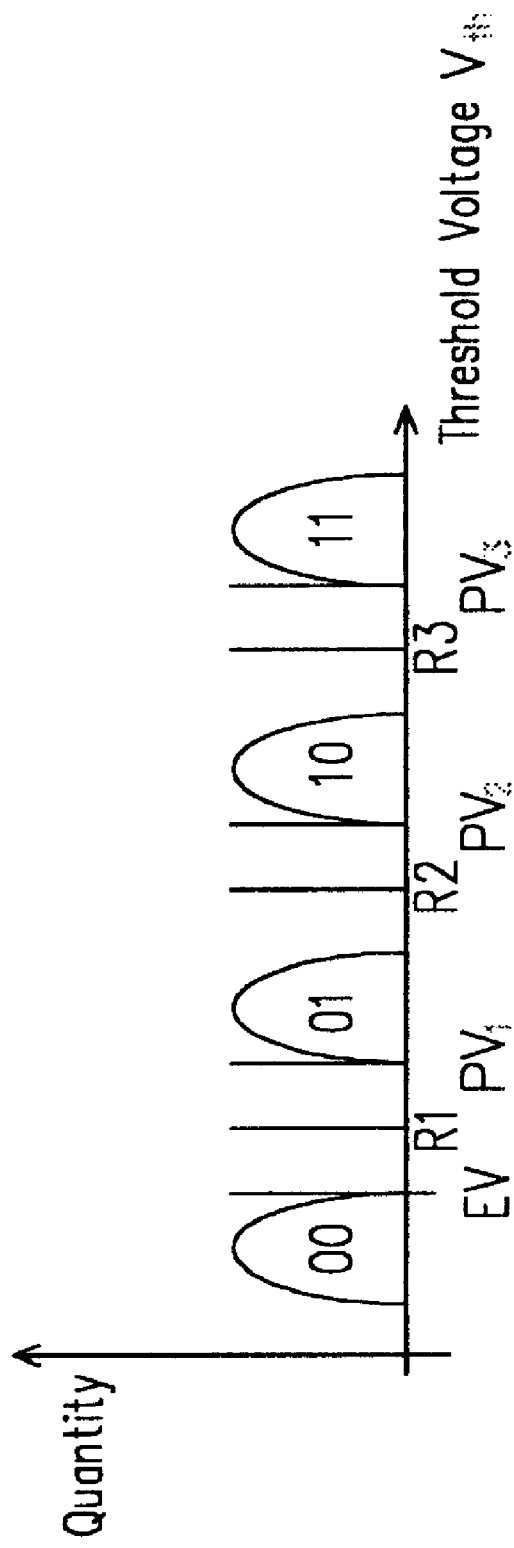
Figure 2:
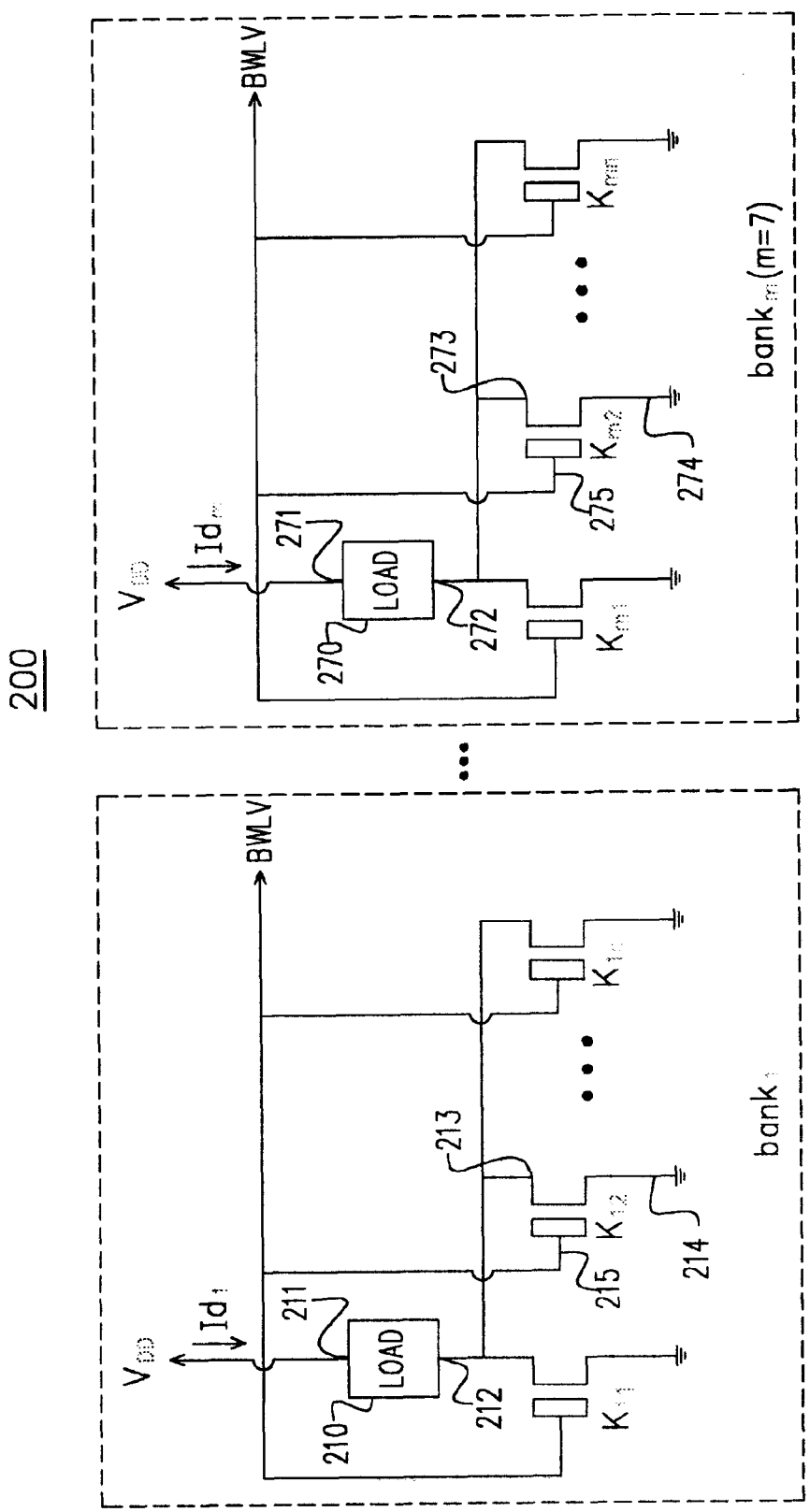
FIG. 2 schematically shows a circuit diagram of a reference current generation circuit of a preferred embodiment according to the present invention.

FIG. 2 schematically shows a circuit diagram of a reference current generation circuit of a preferred embodiment according to the present invention. The reference current generation circuit 200 comprises m units of the reference current generation unit bank1~bankm, where the m value depends on the number of bits for the multiple bit flash memory's flash cell in the reference current generation circuit 200. When the 2-bit flash cell is exemplified, m=7, when the 3-bit flash cell is exemplified, m=15, and the other number of bits for the flash cell can be deducted via the same method accordingly. The 2-bit flash cell (m=7) is exemplified hereinafter.

When the 2-bit flash cell is exemplified, there will be totally 7 reference current generation units bank1~bank7 in the diagram. The reference current generation unit bank1 comprises a load 210 and the reference cells $k_{11}$~$k_{1n}$ that are tightly coupled in parallel. The reference current generation unit bank7 comprises a load 270 and the reference cells $k_{71}$~$k_{7n}$ that are tightly coupled in parallel. The structures of other reference current generation units bank2~bank6 that are not shown in the diagram have the same structure as mentioned above.

The reference cells $k_{11}$~$k_{7n}$ are dummy cells, formed by tightly coupling the floating gate and the control gate of the multiple bit flash memory's flash cell having the same structure together. Since it is much easier to handle the manufacturing process characteristic for the general gate that has a greater dimension, in order to easily handle the characteristic of the reference cells $k_{11}$~$k_{7n}$ and to have the reference current generated have more accurate value, the dimensions of the gate length of the reference cells $k_{11}$~$k_{7n}$ should be made greater than the dimension of the gate length of the multiple bit flash memory's flash cell. For example, when the multiple bit flash memory uses 0.18 μm in its manufacture process, the dimension of the gate length of reference cells $k_{11}$~$k_{7n}$ should be designed as 1 μm.

In addition, for further improving the characteristic of the reference cells $k_{11}$~$k_{7n}$ in designing the placement, the reference cells $k_{11}$~$k_{7n}$ needed by each of the reference current generation units bank1~bank7 can be individually formed in the same bank. In other words, the reference cells $k_{11}$~$k_{7n}$ are formed in the same bank, and the reference cells $k_{71}$~$k_{7n}$ are formed in another bank. Moreover, the reference cell that is not in the bank margin is selected to reduce the characteristic variant factor caused by the margin effect.

Figure 3:
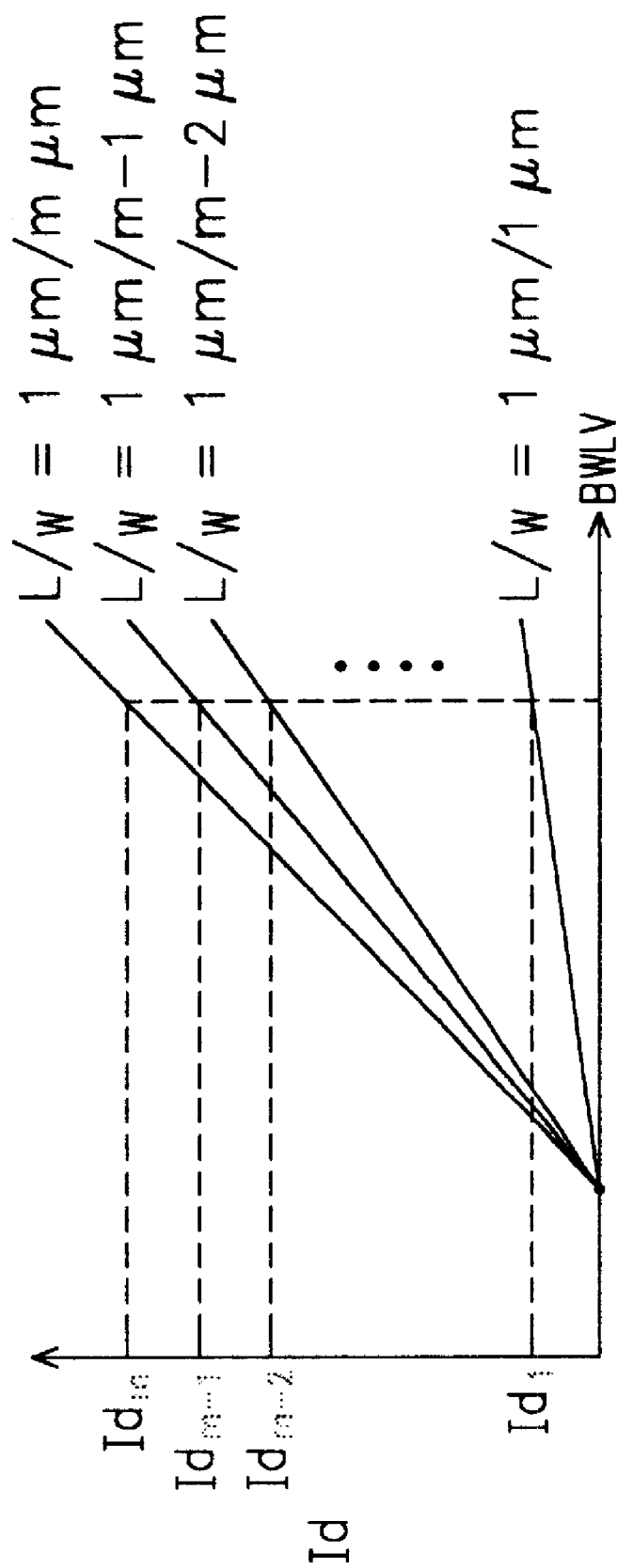
FIG. 3 schematically shows a relationship curve diagram for the reference current of a reference current generation circuit of a preferred embodiment according to the present invention.

As shown in FIG. 3, the load 210 of the reference current generation unit bank1 comprises a first connection terminal 211 and a second connection terminal 212, wherein the first connection terminal 211 couples to an operating power $V_{DD}$, the second connection terminal 212 couples to a first source/drain 213 of the reference cells $k_{11}$~$k_{1n}$ that are coupled in parallel, a second source/drain 214 of the reference cells $k_{11}$~$k_{1n}$ that coupled in parallel is grounded, and a gate 215 coupled in parallel is jointly connected to a boosted word-line voltage BWLV. In addition, the dimensions of the gate length for the reference cells $k_{11}$~$k_{1n}$ mentioned above should be made greater than the dimension of the gate length of the multiple bit flash memory's flash cell, i.e. 1 μm, and the dimensions of the gate width for the reference cells $k_{11}$~$k_{1n}$ should be made based on the magnitude of the reference current $Id_1$ that needs to be generated.

Moreover, the load 270 of the reference current generation unit bank7 comprises a first connection terminal 271 and a second connection terminal 272, wherein the first connection terminal 271 couples to an operating power $V_{DD}$, the second connection terminal 272 couples to a first source/drain 273 of the reference cells $k_{71}$~$k_{7n}$ that are coupled in parallel, a second source/drain 274 of the reference cells $k_{71}$~$k_{7n}$ coupled in parallel is grounded, and a gate 275 coupled in parallel is jointly connected to a boosted word-line voltage BWLV. In addition, the dimensions of the gate length for the reference cells $k_{71}$~$k_{7n}$ mentioned above should be made greater than the dimension of the gate length of the multiple bit flash memory's flash cell, e.g. 1 μm, and the dimensions of the gate width for the reference cells $k_{71}$~$k_{7n}$ should be made based on the magnitude of the reference current $Id_7$ that needs to be generated.

Since the gates 215~275 for each of the reference current generation units bank1~bank7 are coupled in parallel and connected to the same boosted word-line voltage BWLV, and the relationship of the reference current Id that is generated and the gate width W, the gate length L, the boosted word-line voltage BWLV and the threshold voltage Vth for the reference cell itself is shown below:

$$Id \approx W/L(BWLV\ Vth)$$

The gate length L for each of the reference cells $k_{11}$~$k_{7n}$ in the present embodiment are all designed to have the same value, e.g. 1 μm, so that the threshold voltages Vth are all the same. In addition, the gate width W for each of the reference cells $k_{11}$~$k_{7n}$ is made based on the magnitude of the reference currents $Id_1$~$Id_7$ that need to be generated, so that the reference currents $Id_1$~$Id_7$ having different values can be obtained. For example, if the gate width W for each of the reference cells $k_{11}$~$k_{1n}$ is 1 μm, the gate width W for each of the reference cells $k_{21}$~$k_{2n}$ is 2 μm, with the same method, the gate width W for each of the reference cells $k_{71}$~$k_{7n}$ is 7 μm. The relationship curve is as shown in FIG. 3.

While each of the reference current generation units bank1~bank7 mentioned above uses a plurality of reference cells $K_{11}$~$k_{1n}$, . . . , $k_{71}$~$k_{7n}$ that have the same structure to generate the reference currents $Id_1$~$Id_7$ with different values, optionally, the average value can be further calculated and used as the reference currents $Id_1$~$Id_7$. Those who are skilled in the related arts should understand that the reference currents $Id_1$~$Id_7$ can be generated by only using one reference cell selected among the reference current generation units bank1~bank7. For example, the reference current $Id_1$ is generated by only using the reference cell $k_{11}$ in the reference current generation unit bank1, and the reference current $Id_7$ is generated by only using the reference cell $k_{71}$ in the reference current generation unit bank7. Moreover, other reference cells are not merged into the reference current generation circuit.

In summary, the present invention at least has following advantages:

1. Since the same boosted word-line voltage is applied to different reference cell's gate, and different reference cell's gate width is used to obtain the reference currents with different levels, it effectively solves the problem of the reference currents having different drifts along with the variance of the temperature and the power voltage Vcc.

2. Since the gate width and the gate length of the reference cell that has non-critical dimension and one or more than one reference cells in the plurality of reference cells in the same bank are used to generate the reference currents, it is easier to handle the characteristic of each reference cell.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A reference current generation circuit, suitable for a multiple bit flash memory, comprising a plurality of reference current generation units, each of the reference current generation units comprising:

a load, having a first connection terminal and a second connection terminal, wherein the first connection terminal couples to an operating power; and a reference cell, having a gate, a first source/drain, and a second source/drain, wherein the first source/drain couples to the second connection terminal, the second source/drain is grounded, the gate couples to a boosted word-line voltage;

wherein the gate of each of the reference current generation units couples to the same boosted word-line voltage, and a gate width of the reference cell for each of the reference current generation units is different according to a magnitude of the reference current that needs to be generated by the reference current generation units.

2. The reference current generation circuit of claim 1, wherein the reference cell is a dummy cell.

3. The reference current generation circuit of claim 1, wherein a gate length of the reference cell for each of the reference current generation cells is the same, and the dimension of the gate length of the reference cell is greater than the dimensions of a gate length of the multiple bit flash memory's flash cell.

4. The reference current generation circuit of claim 3, wherein the dimension of the gate length of the reference cell is 1 µm.

5. The reference current generation circuit of claim 1, wherein the reference cell is one of a plurality of reference cells that have the same structure and are located in the same bank.

6. The reference current generation circuit of claim 1, wherein the reference cell tightly couples to a plurality of reference cells that have the same structure in parallel to generate the reference current.

* * * * *